(12) United States Patent
Dultz et al.

(10) Patent No.: US 6,338,882 B1
(45) Date of Patent: Jan. 15, 2002

(54) PROCESS FOR APPLYING A LIGHT-BLOCKING LAYER BETWEEN A PHOTOCONDUCTING LAYER AND A MIRROR WHEN MANUFACTURING AN OPTICALLY ADDRESSABLE SPATIAL LIGHT MODULATOR

(75) Inventors: Wolfgang Dultz, Frankfurt am Main; Wolfgang Haase, Reinheim, both of (DE); Leonid Beresnev, Columbia, MD (US); Elena Konshina; Arkadii Onokhov, both of St. Petersburg (RU)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/533,478

(22) Filed: Mar. 23, 2000

(30) Foreign Application Priority Data

Mar. 23, 1999 (DE) .......................... 199 14 112

(51) Int. Cl.$^7$ .............................. H01T 14/00
(52) U.S. Cl. .................. 427/580; 427/58; 427/109; 427/162; 427/165; 427/166; 427/167; 427/249.1; 427/249.15; 427/255.11; 427/255.18; 427/255.28; 427/255.395; 427/255.7; 427/294; 427/419.7; 427/585
(58) Field of Search ................. 427/580, 585, 427/58, 109, 162, 165, 166, 167, 249.1, 249.15, 255.11, 255.18, 255.28, 255.395, 255.7, 294, 419.7

(56) References Cited

PUBLICATIONS

*T.D. Beard et al., "AC Liquid–Crystal Light Valve," Appl. Phys. Lett., vol. 22, No. 3, Feb. 1, 1973, pp. 90–92.
*W.P. Bleha et al., "Application of the Liquid Crystal Light Valve to Real–Time Optical Data Processing," Optical Engineering, vol. 17, No. 4, Jul.–Aug. 1978, pp. 371–385.
*U. Efron et al., "The Silicon Liquid–Crystal Light Valve," J. Appl. Phys, vol. 57, No. 4, Feb. 15, 1985, pp. 1356–1368.
*A.V. Balakov et al., "Production Methods and Properties of Diamond–Like Carbon Films," Sov. J. Opt. Technol., vol. 49, No. 9, Sep. 1982, pp. 591–599.
*A. Bubenzer et al., "Optical Properties of Hydrogenated Hard Carbon Thin Films," Thin Solid Films, vol. 91, 1992, pp. 81–87, (No month avail.).
*A. Bubenzer et al., "RF–Plasma Deposited Amorphous Hydrogenated Hard Carbon Thin Films: Preparation, Properties, and Applications," J. App. Phys., vol. 54, No. 8, Aug. 1983, pp. 4590–4595.
*D.R. McKenzie et al., "Analysis of Films Prepared by Plasma Polymerization of Acetylene in a D.C. Magnetron," Thin Solid Films, vol. 108, 1983, pp. 247–256, (No month avail.).
*F.W. Smith, "Optical Constants of a Hydrogenated Amorphous Carbon Film," J. Appl. Phys. vol. 55, no. 3, Feb. 1, 1984, pp. 764–771.
*Kuniharu Takizawa et al., "Spatial Light Modulators for Projection Displays," Applied Optics, vol. 36, No. 23, Aug. 10, 1997, pp. 5732–5747.

Primary Examiner—Bernard Pianalto
(74) Attorney, Agent, or Firm—Kenyon & Kenyon

(57) ABSTRACT

A method for applying a light-blocking layer between a photoconducting layer and a mirror when making an optically addressable spatial light modulator (OASLM) using a chemical vapor deposition process. The light-blocking layer and the photoconducting layer are applied in a shared process step in which both the thickness and composition of the photoconducting layer to be applied to the transparent electrode, as well as the thickness and composition of the light-blocking layer to be applied to the photoconducting layer are determined by a time-related change of the variation of the gas composition during the deposition process. The structure of the OASLM can be optimally adapted to a desired purpose.

11 Claims, 6 Drawing Sheets

PROCESS FOR APPLYING A LIGHT-BLOCKING LAYER BETWEEN A PHOTOCONDUCTING LAYER AND A MIRROR WHEN MANUFACTURING AN OPTICALLY ADDRESSABLE SPATIAL LIGHT MODULATOR

FIELD OF THE INVENTION

The present invention relates to multi-layer structures containing liquid-crystal layers. In particular, the present invention relates to a process for applying an absorption layer of an optically addressable spatial light modulator (OASLM).

RELATED TECHNOLOGY

OASLMs are used for various areas of optical telecommunications. An example that may be mentioned is that of level balancing in WDM multi-channel systems, as described in W. P. Beard et al., "AC Liquid Crystal Light Valve", Appl. Phs. Lett., Vol. 22, No. 3, 90–92 (1973).

Other applications relate to the local attenuation of strong light sources as glare protection, as well as applications for preventing halation of the image in video cameras, video spectacles, pilot spectacles etc.; see W. P. Bleha, L. P. Lipton, E. Winere, Opt, Eng., Vol 17, No.4, Appl. Phys. Lett, V, Opt. Eng., V, 371–384 (1978).

Particularly important for the optical parallel processing of images is the conversion of optical, incoherent images into the coherent beam path of the optical correlator. Used for this purpose are OASLMs in which the writing and read-out beam paths are optically separated from each other. In the event that the read-out light overlaps spectrally with the sensitivity curve of the photoconductor, it must be completely separated from the writing beam path, because otherwise there are great losses in terms of the sensitivity, resolution and grey-scale range of the OASLM due to this parasitic illumination.

Only in relatively rare cases is it possible to optically separate the writing and read-out beam paths solely through the spectral composition of writing and read-out light, by employing photoconductors which absorb exclusively in the blue light range, while red or infrared light is used for the read-out.

None of the conventional reflecting layers made of metal films or dielectric films have a sufficiently low transmission in order to separate the two beam paths and to prevent the penetration of the read-out light into the photoconductor.

An appreciable improvement in light separation can be achieved by additional absorbing layers between the photoconductor and the reflecting layer of the read-out beam path. A semiconductor layer can be used as the absorbing layer if the band gap is smaller than that of the photoconductor.

Known from W. P. Beard et al., "AC Liquid Crystal Light Valve", Appl. Phs. Lett., Vol. 22, No. 3, 90–92 (1973), W. P. Bleha, L. P. Lipton, E. Winere, Opt. Eng., Vol. 17, No.4, Appl. Phys. Lett, V, Opt. Eng., V, 371–384 (1978) and U. Efron, J. Grinberg, P. O. Braatz, M. J. Little, P. G. Reif and R. N. Schwarts, "The silicon liquid-crystal light valve", J. Appl. Phys., Vol. 57, No. 4, 1356–1368 (1985) is the use of a cadmium-telluride layer CdTe as a light-blocking layer. Therein described is a cadmium-telluride layer CdTe of $2\mu$ thickness, a surface resistance of $10^{11}$ $\Omega$cm and an absorption coefficient not less than $10^5$ cm$^{-1}$ at 525 nm in structures which used cadmium-sulfide CdS as photoconductor. The same light-blocking layer was also employed to improve the properties of light valves on the basis of liquid crystals with amorphous silicon ($\alpha$-Si) as photoconductor. The CdTe layer was applied between the dielectric mirror (based on titanium oxide) and a special adhesive layer (to improve the adhesion of the CdTe to the photoconductor). The adhesive layer included 4 films:

1) an SiO$_2$ film applied in an argon atmosphere,
2) an SiO$_2$ film applied in an argon-oxygen atmosphere,
3) a CdTe film likewise applied in an argon-oxygen atmosphere, and
4) a CdTe film applied once again in an argon atmosphere.

Amorphous carbon $\alpha$-C and amorphous hydrogenated carbon $\alpha$-C:H as such are known as thin films with high light absorption. These materials can be applied by sputtering or vaporization of carbons or by chemical vapor deposition (CVD), with hydrocarbons as precursor; see A. V. Balakov, E. A. Konshina, "Methods of production and properties of diamond-like carbon films", Sov. J. Opt. Technol.", Vol. 49, No. 9, 591–599(1982) and A. Bubenzer, B. Dischler, G. Brandt, P. Koidl, "Optical properties of hydrogenated hard carbon thin films", Thin Solid Films, Vol. 91, 81–87 (1982). Used for this purpose are plasma discharges in the radio-frequency range and magneton gas discharge; see A. Bubenzer, B. Dischler, A. Nyaiesh, "RF-plasma deposited amorphous hydrogenated hard carbon thin films. Preparation, properties and applications", J. Appl. Phys., Vol. 54, 4590–454595 (1983), and D. R. McKenzie, R. C. McPhedran, N. Savvides, "Analysis of films prepared by plasma polymerization of acetylene in a d. c. magnetron", Thin Solid Films, Vol. 108, 247–256 (1983).

It is also possible to employ direct ion-beam and dual-beam deposition, as well as laser erosion from the carbon target. The optical constants of amorphous carbon layers and amorphous, hydrogenated carbon layers depend characteristically on the deposition and on the parameters of the condensation process; see F. W. Smith, "Optical constants of a hydrogenated amorphous carbon film", J. Appl. Phys., Vol. 55, 764–771 (1984).

The described carbon layers are used as reflecting layers or as protective layers in IR optics. Optically visible carbon layers with an absorption in the visible spectral range are employed for selective solar applications and as contrast-intensifying layers for crystal displays.

A carbon-containing film of very complex structure of silicon, germanium and carbon is known from K. Takizawa, T. Fuijii, M. Kawakita, H. Kikuchi, H. Fuijkake, M. Yokozawa, A. Murata and K. Kishi, "Spatial light modulators for projection displays", Applied Optics, Vol. 36, No. 23, 5732–5747 (1997). The layers described therein had a great thickness of 3.5 $\mu$m and more, in order to provide the required absorption and the necessary resistance in an OASLM based on thick (250 $\mu$m) BSO photoconductor layers and polymer-dispersed nematic liquid crystals.

For $\alpha$-Si:H and $\alpha$-Si:C:H photoconducting layers, these blocking layers are too thick to be able to optimize the basic parameters of the OASLM. A further disadvantage is that these complex compositions of Si, Ge and C are too expensive in manufacture.

SUMMARY OF THE INVENTION

The present invention provides a process for applying a light-blocking layer between a photoconducting layer and a mirror when manufacturing an optically addressable spatial light modulator OASLM using the CVD process. The light-blocking layer (4) and the photoconducting layer (3) are applied in a shared process step in which both the thickness and composition of the photoconducting layer (3) to be applied to the transparent electrode (2), as well as the thickness and composition of the light-blocking layer (4) to be applied to the photoconducting layer (3) are determined by a time-related change of the variation of the gas composition during the deposition process. The silanes are continuously replaced by hydrocarbons in the gas atmosphere of the CVD reactor, with the result that a layer sequence composed of photoconducting layer (3) and light-blocking layer (4) is produced, having the desired specific resistances.

The process of the present invention relates to the decoupling of the writing and read-out beam paths of an optically addressable spatial light modulator (OASLM) in reflection mode by applying a light-blocking layer between the writing and read-out beam paths. In order to determine and optimize the properties of the light valve, it should be possible during the process to selectively adjust, within narrow limits, the specific resistances of the layers and therefore the conductivity of the layer sequence of transparent electrode ITO, photoconducting layer and light-blocking layer. At the same time, one should be able to implement the process as simply and cost-effectively as possible.

Transparent electrode ITO 2 is applied onto the class or quartz-glass substrate 1 according to already known process steps of the CVD process in a CVD reactor. According to the present invention, photoconducting layer 3 and light-blocking layer 4 are deposited in one process step. First, in a silane atmosphere, a photoconducting layer 3 of amorphous hydrogenated silicon is deposited on glass or quartz-glass substrate 1, which is coated with transparent electrode ITO 2. Through continuous replacement of the silanes by hydrocarbons in the gas atmosphere of the CVD reactor, a light-blocking layer 4 is deposited, with direct-current discharges, on photoconducting layer 3. Depending on the (gas composition during the deposition process, a light-blocking layer 4 of amorphous carbon $\alpha$-C or amorphous hydrogenated carbon $\alpha$-C:H is produced. Both the thickness of photoconducting layer 3 and the thickness of light-blocking layer 4 are adjusted by the time-related continuous change of the variation of the gas composition during the deposition process, so that a layer sequence is produced having the desired specific resistances. This means that the specific resistance of the layer sequence composed of transparent electrode/ITO 2, photoconducting layer 3 and light-blocking layer 4 is a function both of the respective gas composition during the deposition process and of the length of the deposition process itself. Mirror 5, orienting layer 6 and liquid crystal 7 are applied according to already known process steps.

Light-blocking layer 4, made of amorphous carbon or of amorphous hydrogenated carbon and acting as an absorption layer, is produced by continuously feeding acetylene into the argon (as atmosphere of the CVD reactor and, with direct-current discharges, a light-blocking layer 4 of pure carbon is deposited on photoconducting layer 3. If a layer of acetylene-argon is deposited in a direct-current discharge according to the CVD process, the specific resistance of light-blocking layer 4 is of the order of magnitude of $10^8$ ohm cm. The greater the proportion of acetylene in the acetylene-argon as atmosphere of the CVD reactor, the higher becomes the specific resistance of light-blocking layer 4. Light-blocking carbon layers $\alpha$-C:H deposited from a pure acetylene gas atmosphere have a specific resistance of approximately $10^{12}$ ohm cm.

BRIEF DESCRIPTION OF THE DRAWINGS

Hereinbelow, the process according to the present invention is explained in greater detail on the basis of exemplary embodiments with reference to the drawings, in which.

DETAILED DESCRIPTION

Figure 1:
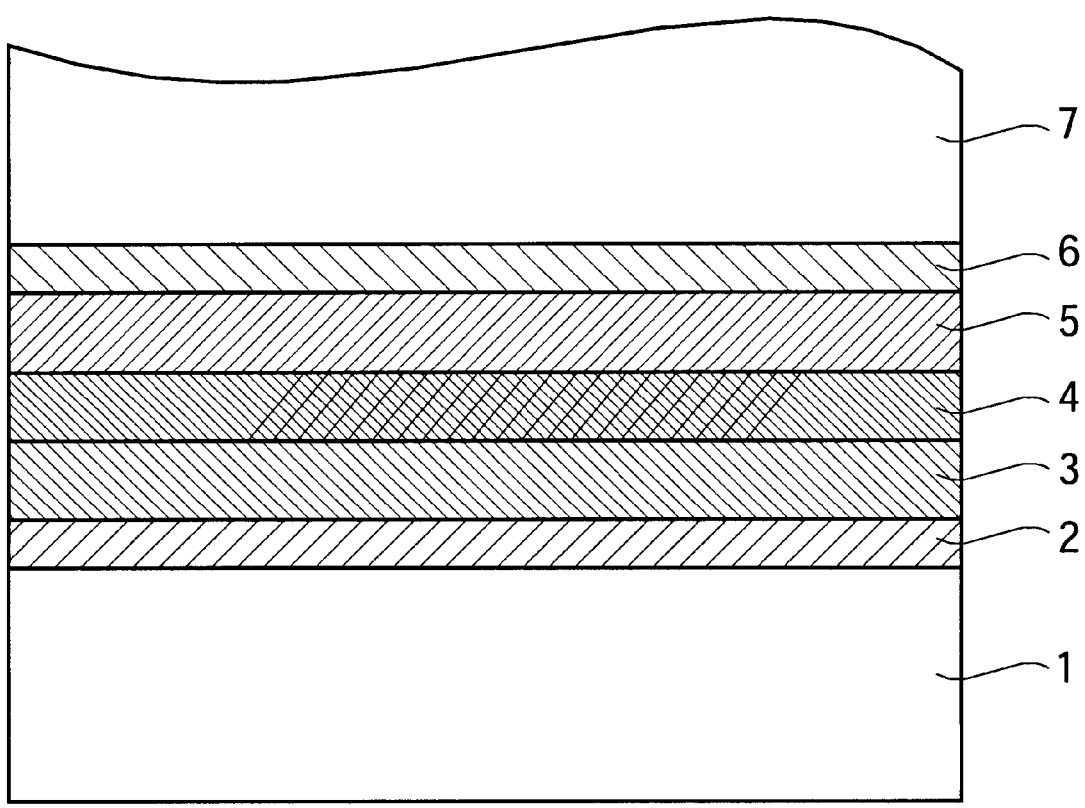
FIG. 1 shows the cross-section of the layers of an OASLM according to the present invention.

FIG. 1 shows the structure of an optically addressable spatial light modulator (OASLM) with light-blocking layer 4 which, according to the present invention, is made of amorphous carbon $\alpha$-C or amorphous, hydrogenated carbon $\alpha$-C:H. The component also includes glass or quartz-glass substrate 1, transparent electrode 2 (ITO), photoconducting layer 3, dielectric mirror 5 and orienting layer 6 for liquid crystal 7.

Light-blocking layer 4 is situated between photoconducting layer 3 and dielectric mirror 5. Its function is to decouple the optical beam paths above and below light-blocking layer 4, thereby improving the properties of the OASLM. Pure carbon films of $\alpha$-C carbon or $\alpha$-C:H carbon are highly absorbent in the visible spectral range. The read-out light which falls from liquid crystal 7 onto mirror 5 is—insofar as it is not reflected—absorbed in light-blocking layer 4 and thus kept away from photoconducting layer 3.

Figure 2:
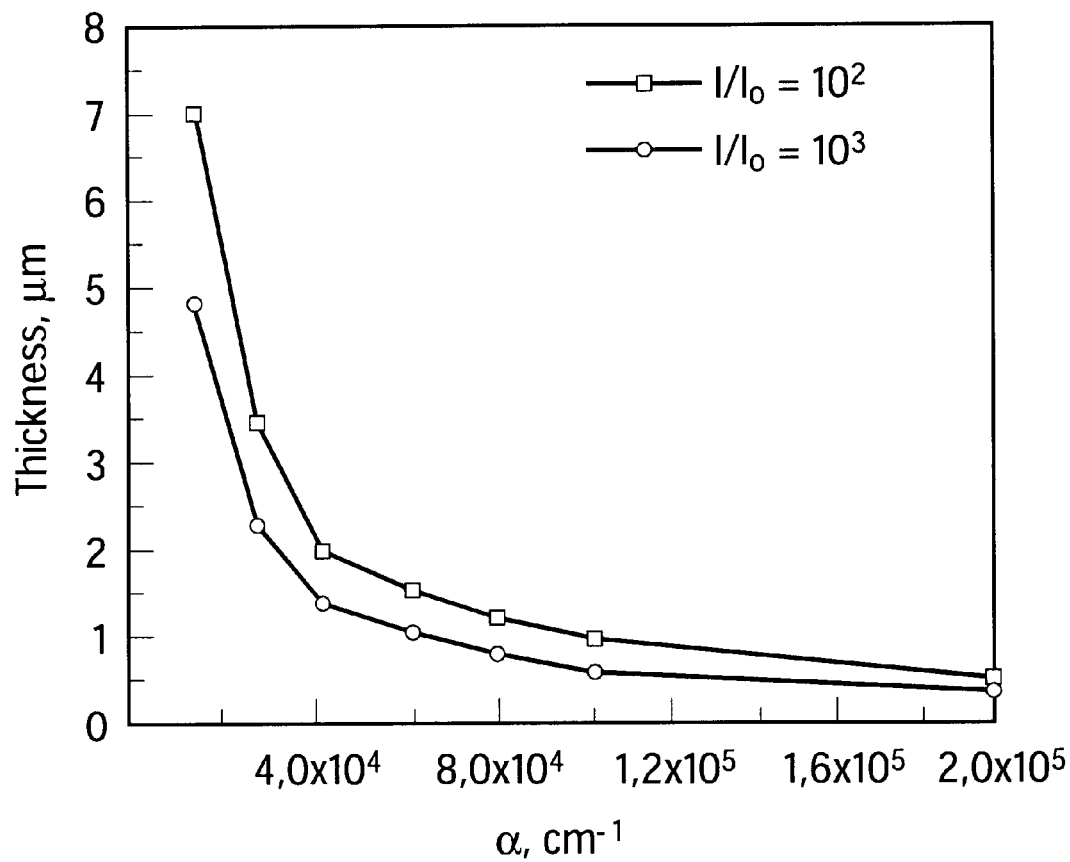
FIG. 2 shows a graph depicting the dependence of the linear absorption coefficient of a light-blocking layer on the thickness of the layer, given a light reduction of 1:100 and 1:1000.

FIG. 2, with reference to a graph, shows that a light-blocking layer 4 with a thickness of 1 $\mu$m and an absorption coefficient $\alpha$ of not less than $5 \cdot 10^4$ cm$^{-1}$ is required for the 100-fold suppression of the light between photoconducting layer 3 and dielectric mirror 5 of the OASLM. For 1000-fold suppression of the light, the absorption coefficient $\alpha$ should not be less than $7 \cdot 10^4$ cm$^{-1}$. For a 2 $\mu$m thick light-blocking layer 4, the absorption coefficient $\alpha$ should be above $3 \cdot 10^4$ ($4 \cdot 10^4$) cm$^{-1}$.

Figure 3:
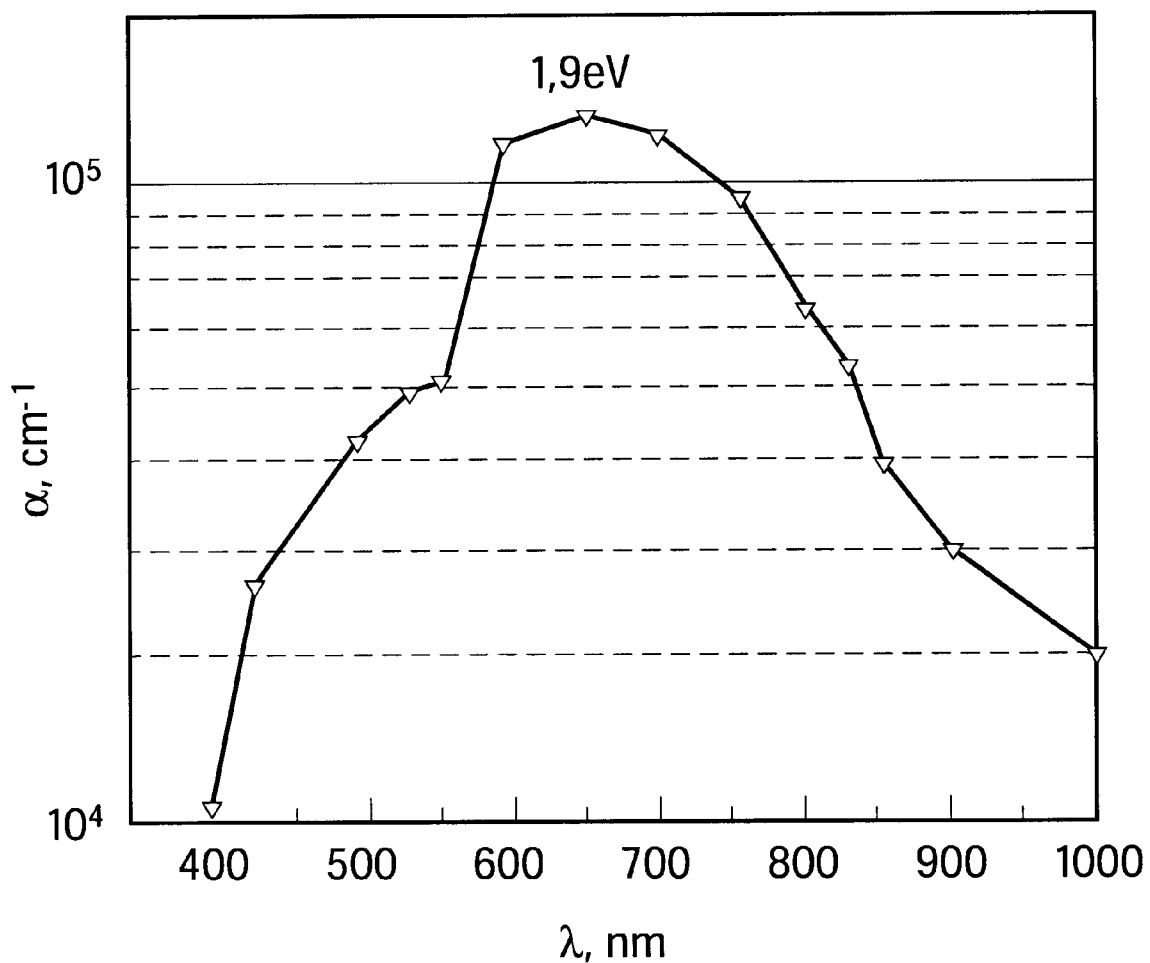
FIG. 3 shows a graph depicting the spectral dependence of the linear absorption coefficient of an amorphous, hydrogenated carbon layer $\alpha$-C:H.

FIG. 3 shows the spectral dependence of the linear absorption coefficient a for a light-blocking layer 4 made of amorphous, hydrogenated carbon $\alpha$-C:H. It can be seen that the absorption coefficient $\alpha$ exceeds the value of $1 \cdot 10^4$ cm$^{-1}$ in the range of a wavelength $\lambda$=400 nm to 1000 nm, and attains an absorption coefficient $\alpha$ of $2 \cdot 10^5$ cm$^{-1}$ at a wavelength of $\lambda$=650 nm.

Figure 4:
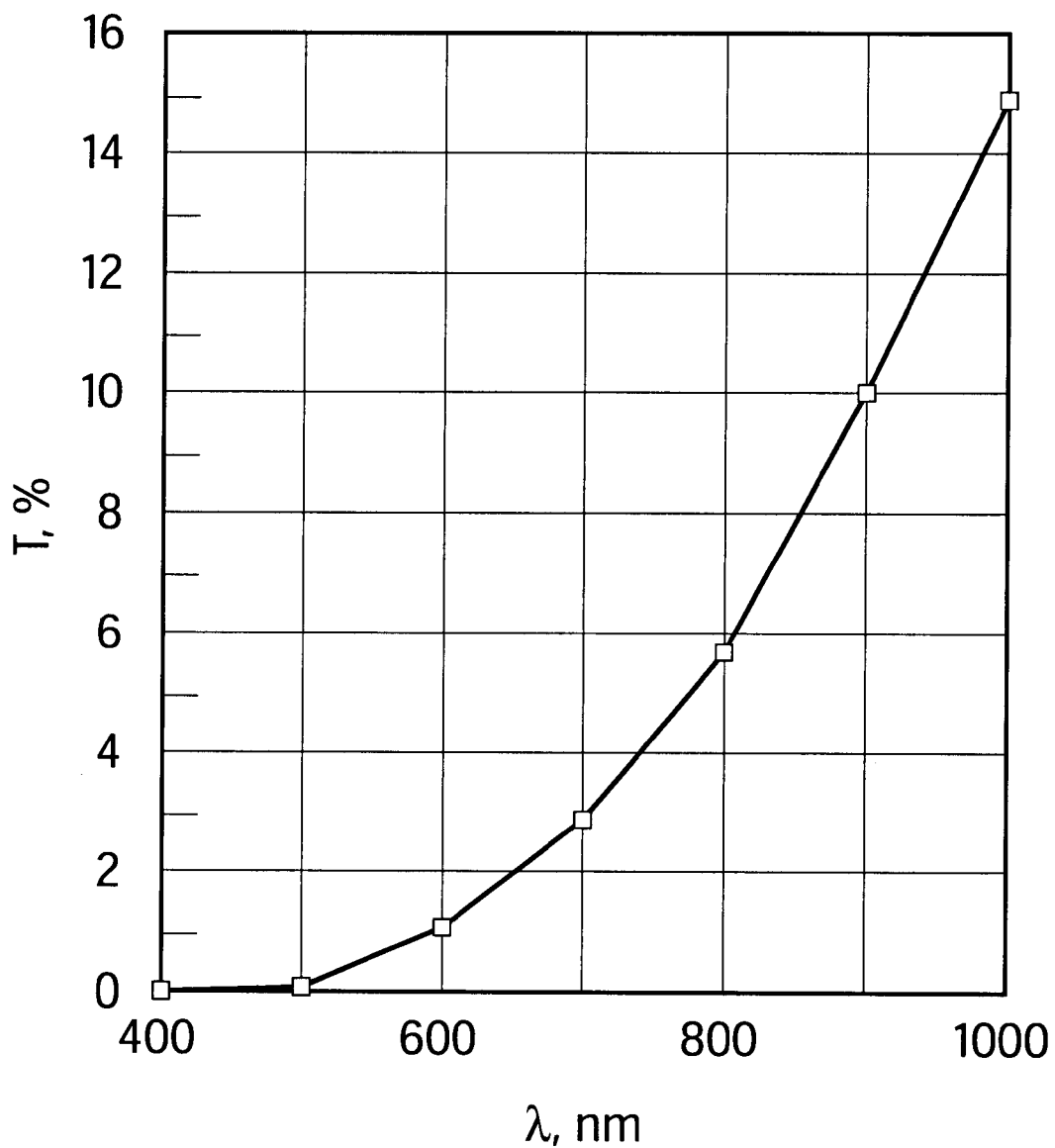
FIG. 4 shows a graph depicting the transmission of a light-blocking layer 4, made of amorphous, hydrogenated carbon $\alpha$-C:H, in the case of 1 $\mu$m thickness.

FIG. 4 shows the transmission of a light-blocking layer 4 of amorphous, hydrogenated carbon $\alpha$-C:H of about 1 $\mu$m thickness. This light-blocking layer 4 has an absorption coefficient $\alpha$=$3.5 \cdot 10^4$ cm$^{-1}$ at a wavelength of $\lambda$=632 nm. The refractive index is approximately 2.2. The transmission is approximately 1% for a wavelength of $\lambda$=632 nm.

Figure 5:
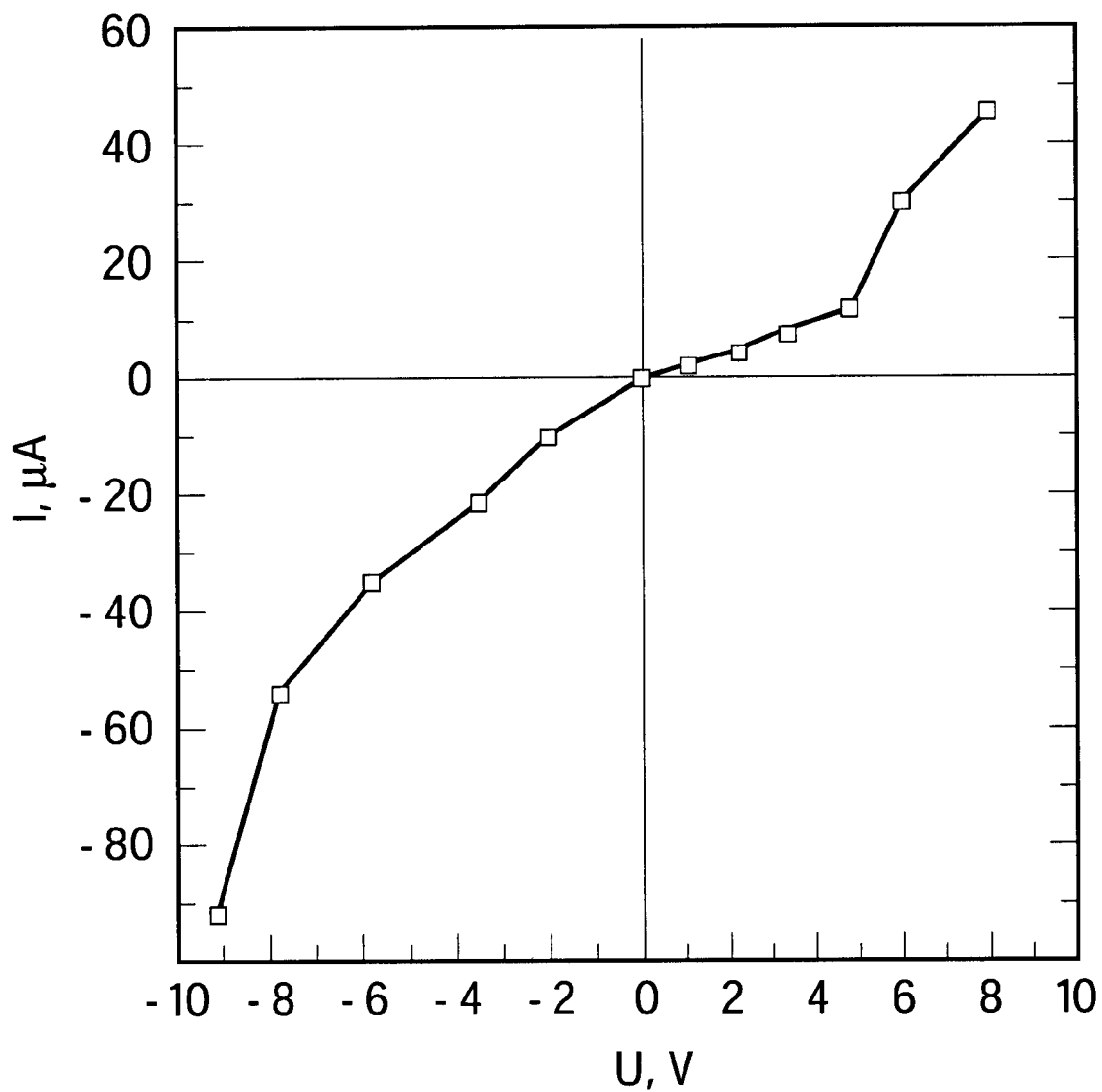
FIG. 5 shows a graph depicting the current-voltage characteristic U(I) for the structure of transparent electrode/ITO 2+light-blocking layer 4 of amorphous, hydrogenated carbon $\alpha$-C:H, deposited from an acetylene-argon mixture+dielectric mirror 5.
Figure 6:
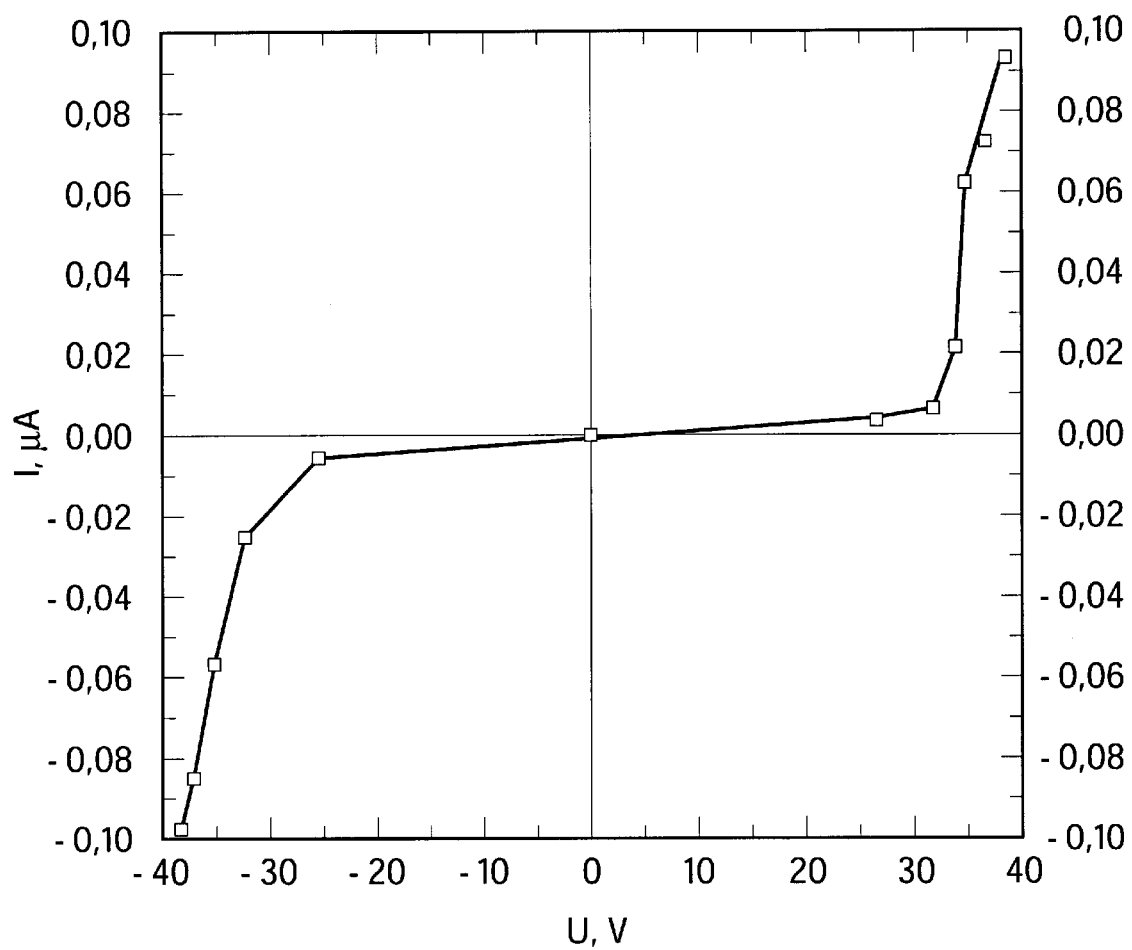
FIG. 6 shows a graph depicting the current-voltage characteristic U(I) for the structure of transparent electrode ITO 2+light-blocking layer 4 of amorphous, hydrogenated carbon $\alpha$-C:H, deposited from an acetylene atmosphere+dielectric mirror 5.

The current-voltage characteristic U(I), see FIGS. 5 and 6, shows that the specific resistance of a light-blocking layer 4, made of amorphous, hydrogenated carbon α-C:H, is of the order of magnitude of $10^8$ ohm cm if the light-blocking layer 4 is deposited from acetylene-argon according to the CVD process in a direct-current discharge. Light-blocking layers 4 of amorphous, hydrogenated carbon α-C:H, deposited from pure acetylene, have a higher specific resistance of $10^{12}$ ohm cm.

Given in the following are examples for the preparation of carbon-containing films which, according to the present invention, ensure particularly good properties as light-blocking layers.

EXAMPLE 1

First, a photoconducting layer 3 of amorphous, hydrogenated silicon α-Si:H is deposited on a glass substrate 1 which is coated with a transparent electrode (ITO) 2. Through continuous replacement of the silanes by acetylene in the gas atmosphere of the CVD reactor, light-blocking layer 4 is deposited with direct-current discharges. Light-blocking layer 4, made of amorphous, hydrogenated carbon α-C:H, was deposited from an acetylene-argon mixture at a pressure of $8·10^4$ torr and a discharge power of 10 watt, with a deposition rate of 2 Å/s. Light-blocking layer 4 of amorphous, hydrogenated carbon α-C:H with a thickness of 1 μm thus produced has an absorption coefficient $α=5.2·10^4$ $cm^{-1}$ and suppresses the optical transmission of the layer sequence: glass or quartz-glass substrate 1+transparent electrode ITO 2+photoconducting layer 3; α-Si:H+light-blocking layer 4; α-C:H by 180-fold at a wavelength of $λ=632$ nm. The specific resistance of layers 2, 3 and 4 was of the order of magnitude of $10^8$ ohm cm.

EXAMPLE 2

As in Example 1, light-blocking layer 4 of amorphous, hydrogenated carbon α-C:H was deposited from a $C_2H_2$+ argon mixture at a pressure of $2·10^{-4}$ torr and a discharge power of 3.6 watt with a deposition rate of 1.7 Å/s. At 0.6 μm thickness, this light-blocking layer 4 had an absorption coefficient $α=5.4·10^4$ $cm^{-1}$. A 30-fold suppression of light was effected by the layer at a wavelength $λ=632$ nm. The specific resistance of the layer sequence of transparent electrode ITO 2+light-blocking layer 4 of amorphous, hydrogenated carbon α-C:H+dielectric mirror 5 was of the order of magnitude of $10^8$ ohm cm.

EXAMPLE 3

As in Example 1, light-blocking layer 4 of amorphous, hydrogenated carbon α-C:H was deposited from a $C_2H_2$+ argon mixture at a pressure of $2·10^{-3}$ and a discharge power of 3.6 watt with a deposition rate 1 Å/s. At a thickness of 0.5 μm, light-blocking layer 4 of amorphous, hydrogenated carbon α-C:H thus obtained has an absorption coefficient of $α=2·10^5$ $cm^{-1}$. In this case, a 530-fold light suppression of the layer sequence of glass substrate 1+transparent electrode ITO 2+photoconducting layer 3 of α-Si:H+light-blocking layer 4 of α-C:H at a wavelength $λ=632$ nm is attained. The specific resistance of the structure of transparent electrode ITO 2+light-blocking layer of amorphous, hydrogenated carbon α-C:H+metal was of the order of magnitude of $10^7$ ohm cm.

EXAMPLE 4

Light-blocking layer 4 was produced by deposition of a layer of amorphous, hydrogenated carbon α-C:H on a layer sequence composed of glass substrate 1, a transparent electrode ITO 2 and a photoconducting layer 3 of amorphous, hydrogenated silicon carbide α-Si:C:H. Light-blocking layer 4 was deposited from pure acetylene at a pressure of $7·10^{-4}$ torr and a discharge power at 5.4 watt, with a deposition rate of 2 Å/s. Light-blocking layer 4, composed of amorphous, hydrogenated carbon α-C:H of thickness 0.9 μm, reduced the optical transmission of the layer sequence of glass substrate 1+transparent electrode ITO 2+photoconducting layer 3 of α-Si:H+light-blocking layer 4 of α-C:H to 250-fold at a wavelength of $λ=632$ nm. The specific resistance of the structure of transparent electrode ITO 2+light-blocking layer 4 of α-C:H+dielectric mirror 5 was of the order of magnitude of $10^{11}$ ohm cm.

EXAMPLE 5

As in Example 4, light-blocking layer 4, made of amorphous, hydrogenated carbon α-C:H, was deposited from pure acetylene, in this case at a pressure of $1·10^{-4}$ torr and a discharge power of 3.6 watt with a deposition rate of 3.4 Å/s. The 1.1 μm thick light-blocking layer 4 with an absorption coefficient of $α=4·10^4$ cm-1 reduced the optical transmission of the layer sequence of glass substrate 1+transparent electrode ITO 2+photoconducting layer of α-Si:C:H+light-blocking layer 4 of α-C:H to 50-fold at a wavelength of $λ=632$ nm. The specific resistance of the structure of transparent electrode 2+light-blocking layer 4 of α-C:H+dielectric mirror 5 was of the order of magnitude of $10^{12}$ ohm cm.

EXAMPLE 6

As in Example 4, light-blocking layer 4, made of amorphous, hydrogenated carbon α-C:H, was deposited from pure acetylene, at a pressure of $7·10^{-4}$ torr and in this case at a discharge power of 3.4 watt with a deposition rate of 0.9 Å/s. Light-blocking layer 4 of thickness 0.5 μm with an absorption coefficient of $α=8·10^4$ $cm^{-1}$ reduced the optical transmission of the layer sequence: glass substrate 1+transparent electrode ITO 2+photoconducting layer 3 of α-Si:C:H+light-blocking layer of α-C:H by 50-fold at a wavelength of $λ=632$ nm. The specific resistance of the structure of transparent electrode 2+light-blocking layer 4 of α-C:H+dielectric mirror 5 was of the order of magnitude of 10 ohm cm.

EXAMPLE 7

As in Example 4, light-blocking layer 4, made of amorphous, hydrogenated carbon α-C:H, was deposited from pure acetylene, in this case at a pressure of $4·10^{-4}$ torr and a discharge power of 4.8 watt with a deposition rate of 1 Å/s. Light-blocking layer 4 thus produced, with a thickness of 0.5 μm and an absorption coefficient of $α=1·10^5$ $cm^{-1}$, reduced the optical transmission of the layer sequence of transparent electrode ITO 2+photoconducting layer 3 of α-Si:C:H+light-blocking layer 4 of α-C:H to 150-fold at a wavelength of $λ=632$ nm. Subsequently, a virtually transparent film of amorphous, hydrogenated carbon α-C:H of only 100 nm thickness was additionally deposited on the optically black α-C:H layer of 0.5 μm thickness formed as light-blocking layer 4. This transparent layer, made of amorphous, hydrogenated carbon α-C:H , was applied from pure acetylene under a pressure of $2·10^{31\ 3}$ torr at a discharge power of 0.6 watt with a deposition rate of 1.7 Å/s. The specific resistance of the structure: transparent electrode ITO 2+photoconducting layer 3+light-blocking layer 4 of α-C:H with additionally applied transparent layer of α-C:H +dielectric mirror 5 rises to a value of the order of magnitude of $10^{13}$ ohm.

It follows from these examples that carbon-containing black layers on the basis of amorphous carbon α-C and amorphous, hydrogenated carbon α-C:H provide a very serviceable light-blocking layer 4 for OASLMs. These layers permit a marked absorption in the visible spectral range (400 nm to 1000 nm) with slight thickness (0.1 $\mu$m to 2.0 $\mu$m) and high specific resistance ($10^7$ to $10^{13}$ Ωcm). The layers produced using the process of the present invention make it possible to manufacture OASLMs with multi-layer structures.

List of Reference Characters

1 Carrier layer of glass or quartz-glass substrate
2 Transparent electrode/ITO
3 Photoconducting layer
4 Light-blocking layer
5 Dielectric mirror
6 Orienting layer for the liquid crystal
7 Liquid crystal
α Absorption coefficient
α-C Amorphous carbon
α-C:H Amorphous hydrogenated carbon
α-Si:C:H Amorphous hydrogenated silicon carbide
λ Wavelength of the light
OASLM Optically addressable spatial light modulator

What is claimed is:

1. A method for applying a light-blocking layer between a photoconducting layer and a mirror when making an optically addressable spatial light modulator using a chemical vapor deposition process, the method comprising
applying the photoconducting layer and the light-blocking layer in a shared process step, a first thickness and a first composition of the photoconducting layer and a second thickness and a second composition of the light-blocking layer being determined by changing a variation of a gas composition as a function of time during the deposition process so as to provide a layer sequence including the photoconducting layer and the light-blocking layer, the layer sequence including desired specific resistances.

2. The method as recited in claim 1 wherein the changing of the variation of the gas composition includes continuously replacing silanes by hydrocarbons in a gas atmosphere of a chemical vapor deposition reactor.

3. The method as recited in claim 1 wherein the photoconducting layer is applied to a transparent electrode of the optically addressable spatial light modulator.

4. The method as recited in claim 1 wherein the photoconducting layer includes amorphous hydrogenated silicon α-Si:H and the applying includes depositing the amorphous hydrogenated silicon α-Si:H in a gas atmosphere of a chemical vapor deposition reactor at a pressure of $8\times10^4$ torr and then continuously replacing silanes of the gas atmosphere by acetylene and using direct-current discharges having a discharge power of 10 watt so as to deposit the light-blocking layer on the photo-conducting layer at a deposition rate of 2 Å/s, the light-blocking layer including amorphous hydrogenated carbon α-C:H and a thickness of 1 $\mu$m and an absorption coefficient $\alpha=5.2\times10^4$ cm$^{-1}$.

5. The method as recited in claim 1 wherein the applying includes using a pressure of $2\times10^{-4}$ torr and a discharge power of 3.6 watt so as to deposit the light-blocking layer on the photoconducting layer at a deposition rate of 1.7 Å/s, the light-blocking layer including a thickness of 0.6 $\mu$m and an absorption coefficient of $\alpha=5.2\times10^4$ cm$^{-1}$.

6. The method as recited in claim 1 wherein the applying includes using a pressure of $2\times10^{-3}$ torr and a discharge power of 3.6 watt in a chemical deposition reactor so as to deposit the light-blocking layer on the photoconducting layer at a deposition rate of 1 Å/s, the light-blocking layer including amorphous hydrogenated carbon α-C:H and a thickness of 0.5 $\mu$m and an absorption coefficient of $\alpha=2\times10^5$ cm$^1$.

7. The method as recited in claim 1 wherein the optically addressable spatial light modulator includes a glass substrate and a transparent electrode and wherein the photoconducting layer includes amorphous hydrogenated silicon carbide α-Si:C:H and wherein the applying includes depositing the amorphous hydrogenated silicon carbide α-Si:C:H and obtaining a gas atmosphere including pure acetylene at a pressure of $7\times10^4$ torr and then using direct-current discharges having a discharge power of 5.4 watt so as to deposit the light-blocking layer at a deposition rate of 2 Å/s, the light-blocking layer including amorphous hydrogenated carbon α-C:H and including a thickness of 0.9 $\mu$m, a transmission of a layer sequence including the glass substrate, the transparent electrode, the photoconduction layer and the light-blocking layer being 1/250.

8. The method as recited in claim 1 wherein the applying includes using a pressure of $1\times10^{-4}$ torr and a discharge power of 3.6 watt so as to deposit the light-blocking layer on the photoconducting layer at a rate of 3.4 Å/s, the light-blocking layer including a thickness of 1.1 $\mu$m and an absorption coefficient of $\alpha=4\times10^4$ cm$^{-1}$.

9. The method as recited in claim 1 wherein the applying includes using a pressure of $7\times10^{-4}$ torr and a discharge power of 3.4 watt so as to deposit the light-blocking layer on the photoconducting layer at a rate of 0.9 Å/s, the light-blocking layer including a thickness of 0.5 $\mu$m thickness and an absorption coefficient of $\alpha=8\times10^4$ cm$^{-1}$.

10. The method as recited in claim 1 wherein the applying includes using a pressure of $4\times10^{-4}$ torr and a discharge power of 4.8 watt so as to deposit the light-blocking layer on the photoconducting layer at a rate of 1 Å/s, the light-blocking layer including a thickness of 0.5 $\mu$m and an absorption coefficient of $\alpha=1\times10^5$ cm$^{-1}$.

11. The method as recited in claim 1 further comprising depositing a transparent, 100 nm-thick layer of amorphous hydrogenated carbon α-C:H onto the light-blocking layer using, a pure acetylene atmosphere under a pressure of $2\times10^{-3}$ torr at a discharge power of 0.6 watt and a deposition rate of 1.7 Å/s.

* * * * *